(12) United States Patent
Chen et al.

(10) Patent No.: US 9,413,360 B2
(45) Date of Patent: Aug. 9, 2016

(54) OSCILLATION MODULE AND SIGNALS CALIBRATING METHOD OF THE SAME

(71) Applicant: CHUNG YUAN CHRISTIAN UNIVERSITY, Taoyuan (TW)

(72) Inventors: Shih-Lun Chen, Taoyuan (TW); Ming-Chun Tuan, Taipei (TW)

(73) Assignee: CHUNG YUAN CHRISTIAN UNIVERSITY, Taoyuan (TW)

( * ) Notice: Subject to any disclaimer, the term of this patent is extended or adjusted under 35 U.S.C. 154(b) by 0 days.

(21) Appl. No.: 14/747,146

(22) Filed: Jun. 23, 2015

(65) Prior Publication Data

US 2016/0191063 A1 Jun. 30, 2016

(30) Foreign Application Priority Data

Dec. 31, 2014 (TW) .............................. 103146411 A

(51) Int. Cl.
| | | |
|---|---|---|
| *H03B 5/32* | (2006.01) | |
| *H03L 7/00* | (2006.01) | |
| *H03L 1/00* | (2006.01) | |
| *G06F 1/12* | (2006.01) | |
| *G06F 13/42* | (2006.01) | |
| *H03B 5/04* | (2006.01) | |

(52) U.S. Cl.
CPC .. *H03L 7/00* (2013.01); *G06F 1/12* (2013.01); *G06F 13/4295* (2013.01); *H03B 5/32* (2013.01); *H03B 5/04* (2013.01); *H03L 1/00* (2013.01)

(58) Field of Classification Search
CPC ......... H03L 1/026; H03L 1/025; H03L 1/028; H03L 7/00; H03B 5/04; H03B 5/36; H03B 5/32; G06F 13/4243; G06F 1/04; G06F 1/12; G06F 13/4295; H04L 7/00; H04L 7/0012; H04L 7/0008
USPC ......... 331/116 R, 116 FE, 158, 108 C, 108 D
See application file for complete search history.

(56) References Cited

U.S. PATENT DOCUMENTS

| | | | | |
|---|---|---|---|---|
| 6,930,917 B2* | 8/2005 | Novac | ....................... | H03B 5/36 365/185.05 |
| 7,030,706 B2* | 4/2006 | Yao | ......................... | H03L 1/026 331/158 |
| 7,679,463 B2* | 3/2010 | Pernia | ..................... | H03L 1/022 331/108 C |
| 9,214,897 B2* | 12/2015 | Yoneyama | ............... | H03B 5/04 |
| 2005/0068118 A1* | 3/2005 | Hein | ....................... | H03L 1/022 331/158 |

* cited by examiner

*Primary Examiner* — Ryan Johnson
(74) *Attorney, Agent, or Firm* — Muncy, Geissler, Olds & Lowe, P.C.

(57) ABSTRACT

An oscillation module includes a frequency generator, a signal calibrator, a multiplexer, and a controller. The oscillation module is calibrated by using calibration parameters and a control instruction of which the frequency and phase are the same as the oscillation frequency signal generated by the frequency generator. As a consequence, an electronic pin used for processing asynchronous signals can be saved so as to reduce the chip area of the oscillation module.

8 Claims, 6 Drawing Sheets

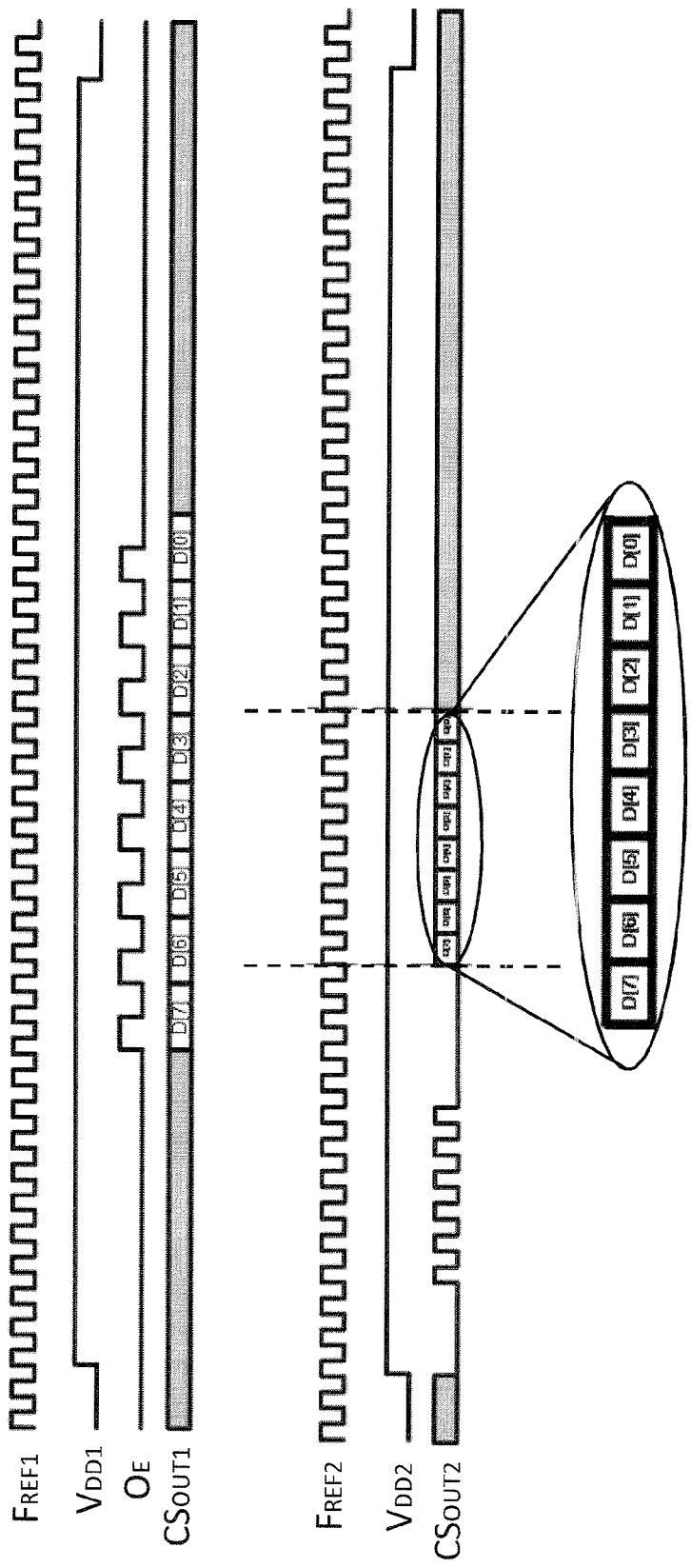

OSCILLATION MODULE AND SIGNALS CALIBRATING METHOD OF THE SAME

FIELD OF THE INVENTION

The present invention relates to an oscillation module, and more particularly relates to an oscillation module utilized to calibrate signal.

BACKGROUND OF THE INVENTION

The electronic products are required to include a frequency to be an operation clock of electrical signals due to the demand of operation of the electronic products. Therefore, the oscillator is one of the significant components for the electronic products. However, the frequency, internal voltage, current or impedance of the quartz crystal unit within the oscillator may not be satisfied the specification due to the cutting of the quartz crystal unit or other customizing requirements. Therefore, the oscillator is calibrated by an external signal calibrator.

Most of the current signal calibrators are designed by asynchronous signal interface. The programmer will write a target frequency parameter which is required to be corrected with an oscillation frequency of the programmer itself into the oscillator. However, since the frequency and the phase of the oscillation frequency signal of the programmer is different from that of the oscillation frequency signal of the oscillator, and the single one electronic pin of the oscillator cannot process the target signal parameter outputted from the programmer and the oscillation frequency signal of the programmer at the same time. Therefore, it is necessary to design an additional electronic pin of the oscillator to receive the oscillation frequency signal of the programmer, and the frequency of the target signal parameter and the frequency of the oscillation frequency signal of the programmer perform the asynchronous process within the oscillator so as to guarantee that the target signal parameter can be written into the oscillator correctly. However, the additional pin of the oscillator will increase both of the chip area of the oscillator and the cost of the oscillator.

SUMMARY OF THE INVENTION

In order to solve the aforementioned problems, an object of the present invention is to provide an oscillation module. The oscillation module in the present invention implements the calibration signal parameter and the control instruction which have the same frequency and phase as the oscillation frequency signal generated from the frequency generator to perform signal calibration. Therefore, an electrical pin for processing asynchronous signal and the chip area for switching asynchronous signal can be saved so as to save the total chip area of the oscillation module.

According to the object described above, the main object of the present invention is to provide an oscillation module which includes a frequency generator, a multiplexer, a controller, and a signal calibrator. The frequency generator has a first end, a second end and a third end. The third end of the frequency generator is grounded, and the first end and the second end of the frequency generator are respectively outputting an oscillation frequency signal. The multiplexer includes a first end, a second end, a third end and a fourth end. The second end of the multiplexer is electrically connected to the second end of the frequency generator to receive the oscillation frequency signal which is outputted from the first end of the multiplexer, and the third end of the multiplexer is grounded. The controller includes a first end, a second end, a third end, a fourth end and, a fifth end. The second end of the controller is electrically connected to an external voltage source, the third end of the controller is grounded, the fourth end of the controller is electrically connected to the first end of the multiplexer to receive the oscillation frequency signal, and the first end thereof outputs the oscillation frequency signal and a first serial signal parameter to the external of the oscillation module, the first end thereof receives the first serial signal parameter, a first serial control instruction and a second serial control instruction in accordance with the oscillation frequency signal, and the fifth end thereof outputs the first serial signal parameter, the first serial control instruction and the second serial control instruction. The signal calibrator includes a first end, a second end, a third end, a fourth end and a fifth end, and the third end thereof is grounded, the first end thereof is electrically connected to the fourth end of the multiplexer, the second end thereof is electrically connected to the fifth end of the controller, the fourth end thereof is connected to the first end of the frequency generator, and the fifth end thereof is electrical connected to the external voltage source. The fourth end thereof is to receive the oscillation frequency signal outputted from the first end of the frequency generator and the second end thereof is to receive the first serial signal parameter, the first serial control instruction and the second serial control instruction from the fifth end of the controller in accordance with the oscillation frequency signal, and thus the signal calibrator converts the first serial signal parameter to be a first parallel signal parameter in accordance with the first serial control instruction and saves the first parallel signal parameter after finishing decoding. The signal calibrator reads the first parallel signal parameter in accordance with the second serial control instruction, converts the first parallel signal parameter back to be the first serial signal parameter to output to the fourth end of the multiplexer, and the first end of the multiplexer outputs the first serial signal parameter to the fourth end of the controller. Herein, the oscillation module only includes three electrical pins, and one of the electrical pins is electrically connected to the third end of the signal calibrator, the other two of the electrical pins are electrically connected to the first end of the controller and the fifth end of the signal calibrator respectively.

According to the object described above, another object of the present invention is to provide an oscillation module which includes a frequency generator, a multiplexer, a controller, and a signal calibrator. The frequency generator includes a first end, a second and a third end. The third end of the frequency generator is grounded, and the first end and the second end of the frequency generator are respectively outputting an oscillation frequency signal. The multiplexer includes a first end, a second end, a third end and a fourth end. The second end thereof is electrically connected to the second end of the frequency generator to receive the oscillation frequency which is outputted from the first end thereof, and the third end of the multiplexer is grounded. The controller including a first end, a second end, a third end, a fourth end and a fifth end. The second end of the thereof is electrically connected to an external voltage source and the third end thereof is grounded, the fourth end thereof is electrically connected to the first end of the multiplexer to receive the oscillation frequency signal, and the first end thereof outputs the oscillation frequency signal and a first serial signal parameter to the external of the oscillation module, the first end thereof receives the first serial signal parameter, a first serial control instruction and a second serial control instruction in accordance with the oscillation frequency signal, and the fifth end thereof outputs the first serial signal parameter, the first serial control instruction and the second serial control instruction. The signal calibrator includes a first end, a second end, a third end, a fourth end and a fifth end. In the signal calibration device, the third end thereof is grounded, the first end thereof is electrically connected to the fourth end of the multiplexer, the second end thereof is electrically connected to the fifth end of the controller, the fourth end thereof is connected to the first end of the frequency generator, and the fifth end thereof is electrical connected to the external voltage source. The fourth end thereof is to receive the oscillation frequency signal outputted from the first end of the frequency generator and the second end thereof is to receive the first serial signal parameter, the first serial control instruction and the second serial control instruction from the fifth end of the controller in accordance with the oscillation frequency signal, and thus the signal calibrator converts the first serial signal parameter to be a first parallel signal parameter in accordance with the first serial control instruction and saves the first parallel signal parameter after finishing decoding. The signal calibrator reads the first parallel signal parameter in accordance with the second serial signal control instruction, and converts the first parallel signal parameter back to be the first serial signal parameter to output to the fourth end of the multiplexer, and the first end of the multiplexer outputs the first serial signal parameter to the fourth end of the controller. Herein, the oscillation module only includes five electrical pins, and two of the electrical pins are electrically connected to an oscillation source outside of the oscillation module, and the other three of the electrical pins are electrically connected to the fifth end of the signal calibrator, the first end of the controller and the fifth end of the signal calibrator respectively.

According to the object described above, another object of the present invention is to provide a frequency calibration method of an oscillation module, comprising providing the oscillation module which includes a frequency generator, a signal calibrator, a multiplexer and a controller, which are electrically connected to each other, providing a programmer which is electrically connected to the oscillation module, outputting an oscillation frequency signal from the frequency generator and the oscillation frequency signal is outputted from the controller to the programmer, outputting a first serial signal parameter, a first serial control instruction and a second serial control instruction from the programmer to the controller in accordance with the oscillation frequency signal, outputting the first serial signal parameter, the first serial control instruction and the second control instruction from the controller to the signal calibrator, converting the first serial signal parameter to be a first parallel signal parameter by the signal calibrator in accordance with the first serial control instruction, decoding and storing the first parallel signal parameter, and reading the first parallel signal parameter by the signal calibrator in accordance with the second serial control instruction and converting the first parallel signal parameter back to be the first serial signal parameter to output to the multiplexer.

DESCRIPTION OF THE DRAWINGS

FIG. 4 is a diagrammatic representation of the waveform comparison of the oscillation module in one embodiment of the present invention and the conventional oscillation module;

DETAILED DESCRIPTION OF THE PREFERRED EMBODIMENTS

An oscillation module is disclosed in the present invention. In the present invention, the programming and writing/reading techniques implemented to the oscillation module by the programmer is well known in the related art, hence the related description is omitted in the following. In the following detailed description of the preferred embodiments, reference is made to the accompanying drawings which form a part hereof, and as shown by way of illustration specific embodiments in which the invention may be practiced. In this regard, directional terminology, such as "top," "bottom," "front," "back," "left," "right," "inside," "outside," "side," etc., is used with reference to the orientation of the Figure(s) being described. As such, the directional terminology is used for purposes of illustration and is in no way limiting the present invention.

The present invention relates to an oscillation module and a signal calibration method thereof, and more particularly, the present invention relates to the oscillation module and the signal calibration method thereof, which includes a frequency generator, a signal calibrator, a controller and a multiplexer.

Figure 1:
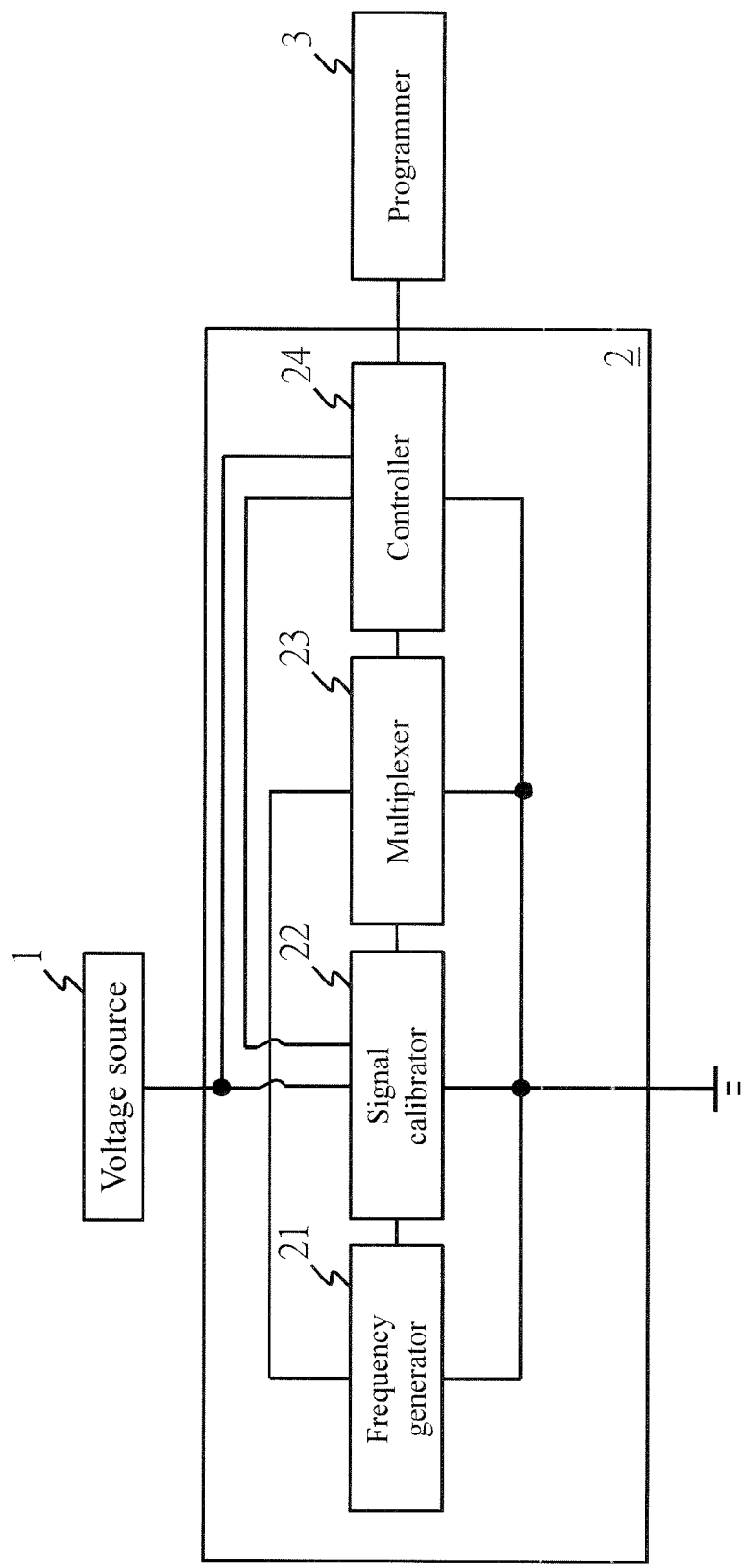
FIG. 1 is a diagrammatic representation of the connection between the oscillation module, an external voltage source and an external programmer in one embodiment of the present invention.

Firstly, please refer to FIG. 1, it is a diagrammatic representation of the connection between the oscillation module, an external voltage source and an external programmer in one embodiment of the present invention.

As shown in FIG. 1, the oscillation module 2 in the present invention is electrically connected to the external voltage source 1 and the external programmer 3. The oscillation module 2 includes a frequency generator 21, a signal calibrator 22, a multiplexer 23 and a controller 24. The frequency generator 21 includes a first end, a second end and a third end. The signal calibrator 22 includes a first end, a second end, a third end, a fourth end, and a fifth end. The multiplexer 23 includes a first end, a second end, a third end, and a fourth end. The controller 24 includes a first end, a second end, a third end, a fourth end and a fifth end. The first end of the frequency generator 21 is electrically connected to the fourth end of the signal calibrator 22. The second end of the frequency generator 21 is electrically connected to the second end of the multiplexer 23. The third end of the frequency generator 21 is grounded. The first end of the signal calibrator 22 is electrically connected to the fourth end of the multiplexer 23. The second end of the signal calibrator 22 is electrically connected to the fifth end of the controller 24. The third end of the signal calibrator 22 is grounded. The fifth end of the signal calibrator 22 is electrically connected to the voltage source 1. The first end of the multiplexer 23 is electrically connected to the fourth end of the controller 24. The third end of the multiplexer 23 is grounded. The first end of the controller 24 is electrically connected to the programmer 3. The second end of the controller 24 is electrically connected to the voltage source 1. The third end of the controller 24 is grounded. The controller 24 determines whether the signal calibrator 22 is to operate or not according to the voltage level of the voltage source 1. When the voltage level of the voltage source 1 is high voltage level, the signal calibrator 22 is in an operating state, so that the controller 24 can receive the signal which is outputted from the programmer 3 and the controller 24 can output the signal to the programmer 3. On the other hand, when the voltage level of the voltage source 1 is low voltage level, the controller 24 can only output the signal to the programmer 3.

Please still refer to FIG. 1. When the voltage level of the voltage source 1 is low voltage level, the signal calibrator 22 is not operated. The first end of the frequency generator 21 outputs the oscillation frequency signal to the fourth end of the signal calibrator 22, and the second end of the frequency generator 21 outputs the oscillation frequency signal to the second end of the multiplexer 23. After the second end of the multiplexer 23 receives the oscillation frequency signal, the first end of the multiplexer 23 outputs the oscillation frequency signal to the fourth end of the controller 24. After the fourth end of the controller 24 receives the oscillation frequency signal, the first end of the controller 24 outputs the oscillation frequency signal to the programmer 3. Then, the voltage level of the voltage source 1 is turned to be the high voltage level, and the signal calibrator 22 starts to operate in accordance with the oscillation frequency signal outputted from the frequency generator 21. The programmer 3 outputs the first serial signal parameter and the first serial control instruction to the first end of the controller 24 in accordance with the oscillation frequency signal. The frequency and the phase of the oscillation frequency signal are the same as that of the first serial signal parameter and the first serial control instruction, which are outputted from the programmer 3. The first end of the controller 24 receives the first serial signal parameter and the first serial control instruction outputted from the programmer 3 in accordance with the oscillation frequency signal, and the fifth end of the controller 24 outputs the first serial signal parameter and the first serial control instruction to the second end of the signal calibrator 22. After the second end of the signal calibrator 22 receives the first serial signal parameter and the first serial control instruction outputted from the fifth end of the controller 24 in accordance with the oscillation frequency signal, the signal calibrator 22 converts the first serial signal parameter to be a first parallel signal parameter in accordance with the first serial control instruction and decodes and stores the first parallel signal parameter.

Next, please still refer to FIG. 1, when the user determines whether the pulse signal outputted from the oscillation module 2 is satisfied the specification or not, the voltage level of the voltage source 1 is switched to be low voltage level. The frequency generator 21 reads the first parallel signal parameter stored in the signal calibrator 22 and the second end of the frequency generator 21 outputs the first oscillation frequency signal to the second end of the multiplexer 23 in accordance with the first parallel signal parameter. After the first end of the multiplexer 23 outputs the first oscillation frequency signal to the fourth end of the controller 24 and the first end of the controller 24 outputs the first oscillation frequency signal to the programmer 3, the voltage level of the voltage source 1 is turned to be the high voltage level. At this moment, the programmer 3 outputs the second serial control instruction to the first end of the controller 24 in accordance with the first oscillation frequency signal. The fifth end of the controller 24 outputs the second serial control instruction to the second end of the signal calibrator 22. After the second end of the signal calibrator 22 receives the second serial control instruction, the signal calibrator 22 reads the stored first parallel signal parameter in accordance with the second serial control instruction and converts the first parallel signal parameter back to be the first serial signal parameter. The signal calibrator 22 outputs the first serial signal parameter to the fourth end of the multiplexer 23. After the multiplexer 23 receives the first serial signal parameter, the first end thereof outputs the first serial signal parameter to the fourth end of the controller 24. After the fourth end of the controller 24 receives the first serial signal parameter, the first end of the controller 24 outputs the first serial signal parameter to the programmer 3 so as to finish reading the first serial signal parameter. When the user determines the first serial signal parameter outputted from the oscillation module 2 is not satisfied the specification, the operations of storing the parallel signal parameter and reading the serial signal parameter are repeated until the serial signal parameter outputted from the oscillation module 2 is satisfied the specification.

Figure 2:
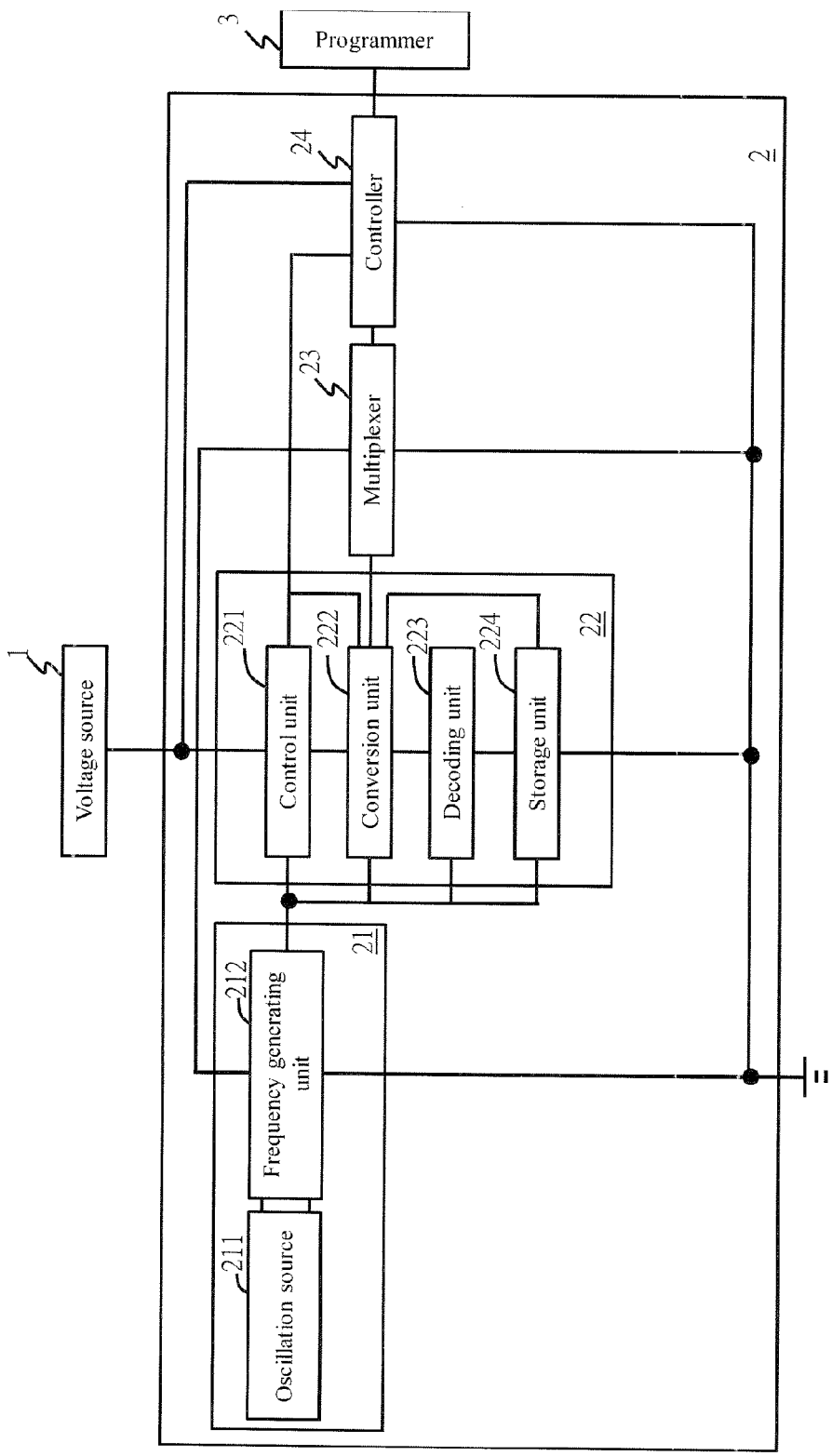
FIG. 2 is a detailed diagrammatic representation of the detailed connection between the oscillation module, the external voltage source and the programmer in one embodiment of the present invention.

Now, please refer to FIG. 2, it is a detailed connecting view of the oscillation module 2, the external voltage source 1 and the programmer 3 in one embodiment of the present invention.

As shown in FIG. 2, the oscillation module 2 includes a frequency generator 21, a signal calibrator 22, a multiplexer 23 and a controller 24. The frequency generator 21 includes an oscillation source 211 and a frequency generating unit 212. The frequency generating unit 212 includes a first end, a second end, a third end, a fourth end and a fifth end. In the frequency generating unit 212, two ends of the oscillation source 211 are electrically connected to the first end and the second end of the frequency generating unit 212, and the third end of the frequency generating unit 212 is electrically connected to the second end of the multiplexer 23. Then, the fourth end of the frequency generating unit 212 is electrically connected to the fourth end of the signal calibrator 22, and the fifth end of the frequency generating unit 212 is grounded. The signal calibrator 22 includes a control unit 221, a conversion unit 222, a decoding unit 223 and a storage unit 224. The control unit 221 includes a first end, a second end, a third end and a fourth end. The conversion unit 222 includes a first end, a second end, a third end and a fourth end. The decoding unit 223 includes a first end, a second end, and a third end. The storage unit 224 includes a first end, a second end, a third end and a fourth end. The first end of the control unit 221 is electrically connected to the external voltage source 1, and the second end of the control unit 221 is electrically connected to the first end of the conversion unit 222, and the third end of the control unit 221 is electrically connected to the fourth end of the frequency generating unit 212, and the fourth end of the control unit 221 is electrically connected to the fifth end of the controller 24. The second end of the conversion unit 222 is electrically connected to the first end of the decoding unit 223, and the third end of the conversion unit 222 is electrically connected to the fourth end of the frequency generating unit 212, and the fourth end of the conversion unit 222 is electrically connected to the fourth end of the multiplexer 23. The second end of the decoding unit 223 is electrically connected to the first end of the storage unit 224, and the third end of the decoding unit 223 is electrically connected to the fourth end of the frequency generating unit 212. Finally, the second end of the storage unit 224 is grounded, and the third end of the storage unit 224 is electrically connected to the fourth end of the frequency generating unit 212, and the fourth end of the storage unit 224 is electrically connected to the fourth end of the conversion unit 222.

Please still refer to FIG. 2. First, the voltage level of the voltage source 1 is set to be at the low voltage level, therefore, the control unit 221, the conversion unit 222, the decoding unit 223 and the storage unit 224 are not operated. The first end and the second end of the frequency generating unit 212 trigger the oscillation source 211 to oscillate such that the third end and the fourth end of the frequency generating unit 212 generate the oscillation frequency signal. The fourth end of the frequency generating unit 212 outputs the oscillation frequency signal to the third ends of the control unit 221, the conversion unit 222, the decoding unit 223 and the storage unit 224. The third end of the frequency generating unit 212 outputs the oscillation frequency signal to the second end of the multiplexer 23. After the second end of the multiplexer 23 receives the oscillation frequency signal, the first end of the multiplexer 23 outputs the oscillation frequency signal to the fourth end of the controller 24. After the fourth end of the controller 24 receives the oscillation frequency signal, the oscillation frequency signal is outputted from the first end of the controller 24 to the programmer 3. Thereafter, the voltage level of the voltage source 1 is switched to be the high voltage level, and the control unit 221, the conversion unit 222, the decoding unit 223 and the storage unit 224 are started to be operated in accordance with the oscillation frequency signal outputted from the frequency generating unit 212. At this time, the programmer 3 outputs the first serial signal parameter and the first serial control instruction to the first end of the controller 24 in accordance with the oscillation frequency signal. After the first end of the controller 24 receives the first serial signal parameter and the first serial control instruction in accordance with the oscillation frequency signal, the fifth end of the controller 24 outputs the first serial signal parameter and the first serial control instruction to the fourth end of the conversion unit 222 and the fourth end of the control unit 221 respectively. After the fourth end of the control unit 221 receives the first serial control instruction, the second end of the control unit 221 outputs the first serial control instruction to the first end of the conversion unit 222 and the conversion unit 222 converts the first serial signal parameter to be the first parallel signal parameter in accordance with the first serial control instruction. The first serial control instruction is used to control the conversion unit 222 to determine the amount of the digital bits of the first serial signal parameter that should be converted. Then, the second end of the conversion unit 222 outputs the first parallel signal parameter to the first end of the decoding unit 223 to decode. The decoding unit 223 decodes the first parallel signal parameter and outputs the decoded first parallel signal parameter to the first end of the storage unit 224 from the second end of the decoding unit 223. The first end of the storage unit 224 receives and stores the first parallel signal parameter outputted from the second end of the decoding unit 223.

Next, please still referring to FIG. 2. When the user needs to determine whether the pulse signal outputted from the oscillation module 2 is satisfied the specification, the voltage level of the voltage source 1 is switched to be the low voltage level. The fourth end of the frequency generating unit 212 reads the stored first parallel signal parameter in the storage unit 224 and the first end and the second end of frequency generating unit 212 triggers the oscillation source 211 to oscillate. Thereafter, the third end of the frequency generating unit 212 outputs the first oscillation frequency signal, which is satisfied the first parallel signal parameter, to the second end of the multiplexer 23, and the first end of the multiplexer 23 outputs the first oscillation frequency signal to the fourth end of the controller 24, then the first oscillation frequency signal is outputted to the programmer 3 from the first end of the controller 24, afterwards, the voltage level of the voltage source 1 is switched to be the high voltage level. One end of the programmer 3 outputs the second serial control instruction to the first end of the controller 24 in accordance with the first oscillation frequency signal. After the one end of the controller 24 receives the second signal control instruction, the fifth end of the controller 24 outputs the second serial control instruction to the fourth end of the control unit 221. After the fourth end of the control unit 221 receives the second serial control instruction, the third end of the control unit 221 outputs the second serial control instruction to the third end of the storage unit 224. After the third end of the storage unit 224 receives the second serial control instruction, the storage unit 224 outputs the first parallel signal parameter to the fourth end of the conversion unit 222 in accordance with the second serial control instruction. After the fourth end of the conversion unit 222 receives the first parallel signal parameter, the first parallel signal parameter is converted back to be the first serial signal parameter, and the first serial signal parameter is outputted to the fourth end of the multiplexer 23 from the fourth end of the conversion unit 222. The first end of the multiplexer 23 outputs the first serial signal parameter to the fourth end of the controller 24, and the first end of the controller 24 outputs first serial signal parameter to the programmer 3 and the operation for reading the first serial signal parameter is finished. When the user determines that the first serial signal parameter is not satisfied the specification, the operations for reading the stored parallel signal parameter and writing the serial signal parameter are repeated until the serial signal parameter outputted from the oscillation module 2 is satisfied the specification.

Figure 3:
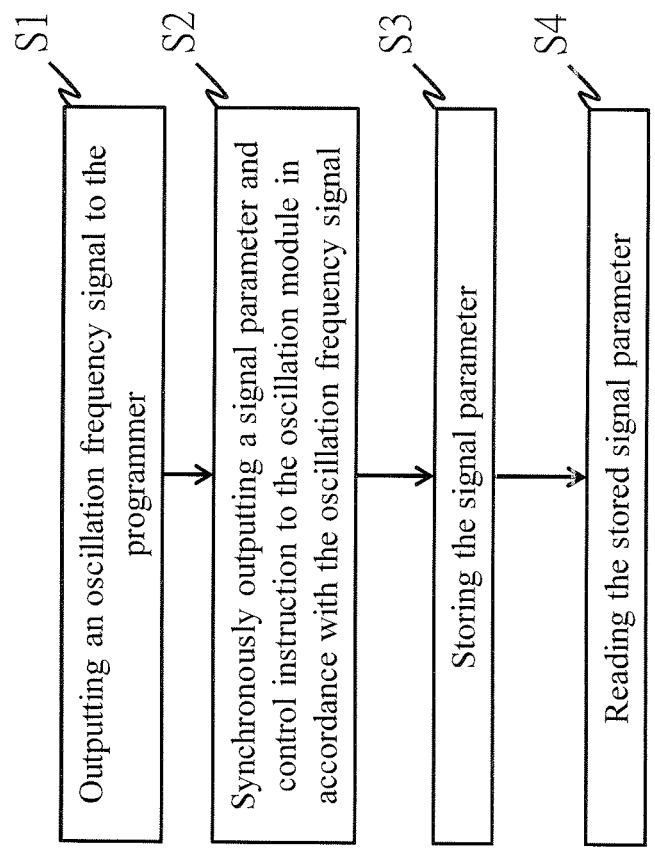
FIG. 3 is a flow chart of the frequency calibration procedures of the oscillation module in one embodiment of the present invention.

Now, please referring to FIG. 2 and FIG. 3, and FIG. 3 is a flow chart of the frequency calibration procedures of the oscillation module in one embodiment of the present invention.

Firstly, as shown in step S1, the voltage level of the voltage source 1 is the low voltage level, and the operation unit 221, the conversion unit 222, the decoding unit 223 and the storage unit 224 are not operated. The first end and the second end of the frequency generating unit 212 trigger the oscillation source 211 to oscillate, and the third end and the fourth end of the frequency generating unit 212 generate the oscillation frequency signal. The fourth end of the frequency generating unit 212 outputs the oscillation frequency signal to the third ends of the control unit 221, the conversion unit 222, the decoding unit 223, and the storage unit 224, and the third end of the frequency generating unit 212 outputs the oscillation frequency signal to the second end of the multiplexer 23. After the second end of the multiplexer 23 receives the oscillation frequency signal, the oscillation frequency signal is outputted to the fourth end of the controller 24 from the first end of the multiplexer 23, and the first end of the controller 24 outputs oscillation frequency signal to the programmer 3. In step S2, one end of the programmer 3 receives the oscillation frequency signal and the voltage level of the voltage source 1 is switched to be the high voltage level. The control unit 221, the conversion unit 222, the decoding unit 223 and the storage unit 224 are started to operate in accordance with the oscillation frequency signal outputted from the frequency generating unit 212. At this time, the programmer 3 outputs the first serial signal parameter and the first serial control instruction to the first end of the controller 24. The first end of the controller 24 receives the serial signal parameter and the first serial control instruction in accordance with the oscillation frequency signal. The fifth end of the controller 24 outputs the first serial signal parameter and the first control instruction respectively to the fourth end of the conversion unit 222 and the fourth end of the control unit 221. At step S3, after the fourth end of the control unit 221 receives the first serial control instruction, the second end of the control unit 221 outputs the first serial control instruction to the first end of the conversion unit 222. The conversion unit 222 converts the first serial signal parameter to be the first parallel signal parameter in accordance with the first serial control instruction. The first serial control instruction is used to control the conversion unit 222 that the amount of the digital bits of the first serial signal parameter which the conversion unit 222 should be converted. Then, the second end of the conversion unit 222 outputs the first parallel signal parameter to the first end of the decoding unit 223 to decode. The decoding unit 223 decodes the first parallel signal parameter and outputs the decoded first parallel signal parameter to the first end of the storage unit 224 from the second end of the decoding unit 223. The first end of the storage unit 224 receives and stores the first parallel signal parameter outputted from the second end of the decoding unit 223.

Finally, at step S4, when the user checks whether the pulse signal outputted from the oscillation module 2 is satisfied the specification, the voltage level of the voltage source 1 is switched to be the low voltage level. The fourth end of the frequency generating unit 212 reads the first parallel signal parameter stored in the storage unit 224 and the first end and the second end of frequency generating unit 212 trigger the oscillation source 211 to oscillate. Thereafter, the third end of the frequency generating unit 212 outputs the first oscillation frequency signal, which is satisfied the first parallel signal parameter, to the second end of the multiplexer 23. The first end of the multiplexer 23 outputs the first oscillation frequency signal to the fourth end of the controller 24, and the first end of the controller 24 outputs the first oscillation frequency signal to the programmer 3, and the voltage level of the voltage source 1 is switched to be at the high voltage level. One end of the programmer 3 outputs the second serial control instruction to the first end of the controller 24 in accordance with the first oscillation frequency signal. After the first end of the controller 24 receives the second signal control instruction, the fifth end of the controller 24 outputs the second serial control instruction to the fourth end of the control unit 221. After the fourth end of the control unit 221 receives the second serial control instruction, the third end of the control unit 221 outputs the second serial control instruction to the third end of the storage unit 224. After the third end of the storage unit 224 receives the second serial control instruction, the storage unit 224 outputs the first parallel signal parameter to the fourth end of the conversion unit 222 in accordance with the second serial control command. After the fourth end of the conversion unit 222 receives the first parallel signal parameter, the first parallel signal parameter is converted back to be the first serial signal parameter and the first serial signal parameter is outputted to the fourth end of the multiplexer 23 from the fourth end of the conversion unit 222. The first end of the multiplexer 23 outputs the first serial signal parameter to the fourth end of the controller 24, and the first end of the controller 24 outputs the first serial signal parameter to the programmer 3 and the operation for reading the first serial signal parameter is finished.

When the user determines that the first serial signal parameter is not satisfied the specification, the steps S1~S4 are repeated until the serial signal parameter outputted from the oscillation module 2 is satisfied the specification.

Now, please referring to FIG. 4, and it is a waveform comparison view of the oscillation module in the present invention.

As shown in FIG. 4, the up view is the waveform view of the conventional oscillator and the bottom view is the waveform view of the oscillation module of the present invention. Herein, $F_{REF1}$ is the oscillation frequency signal outputted to the programmer by the conventional oscillator. $F_{REF2}$ is the oscillation frequency outputted to the programmer 3 by the oscillation module 2 of the present invention. $V_{DD1}$ and $V_{DD2}$ are the voltage level signal outputted from the voltage source. $CS_{OUT1}$ is the signal parameter written into the oscillator by the programmer in the conventional art. $CS_{OUT2}$ is the signal parameter transmitted between the oscillation module 2 and programmer 3, and $CS_{OUT2}$ is also the control instruction that the programmer 3 outputs to the oscillation module 2. $O_E$ is the operation frequency signal of the programmer of the conventional art. As FIG. 4 shows, the frequency of the oscillation frequency signal $F_{REF1}$ outputted from the conventional oscillator to the programmer is very different from the frequency of the operation frequency signal $O_E$ of the programmer, so the convention oscillator cannot directly store the bit signal $CS_{OUT}$ outputted from the programmer in accordance with the oscillation frequency signal $F_{REF1}$. The conventional method is to output the bit signal $SC_{OUT1}$ to the oscillator in accordance with the operation frequency signal $O_E$ of the programmer, and after the oscillator receives the bit signal $CS_{OUT1}$ outputted from the programmer, the oscillator has to asynchronize the bit signal $CS_{OUT1}$ and the oscillation frequency signal $F_{REF1}$ of the oscillator due to the significantly different frequency between the bit signal $CS_{OUT1}$ and the oscillation frequency single $F_{REF1}$. When the bit signal $CS_{OUT1}$ and the oscillation frequency signal $F_{REF1}$ of the oscillator complete asynchronizing, the bit signal CSout1 can be stored in the oscillator. On the other hand, in the present invention, after the oscillation frequency signal $F_{REF2}$ is outputted to the programmer 3 from the oscillation module 2, the programmer 3 inputs the signal parameter and the control instruction to the oscillation module 2 in accordance with the oscillation frequency signal. More specifically, the signal parameter and the control instruction are written along with the oscillation frequency signal into the oscillation module 2 instead of accompanying with the operation frequency signal of the programmer 3, and thus the operation frequency signal of the programmer 3 is not required to be inputted.

In the aforementioned embodiment of the present invention, the first serial signal parameter outputted from the programmer is stored in the oscillation module, and the oscillation module outputs the oscillation frequency signal satisfied the first serial signal parameter to the programmer. The programmer reads the first serial signal parameter in accordance with the oscillation frequency signal so as to achieve the purpose of the signal calibration.

Figure 5A:
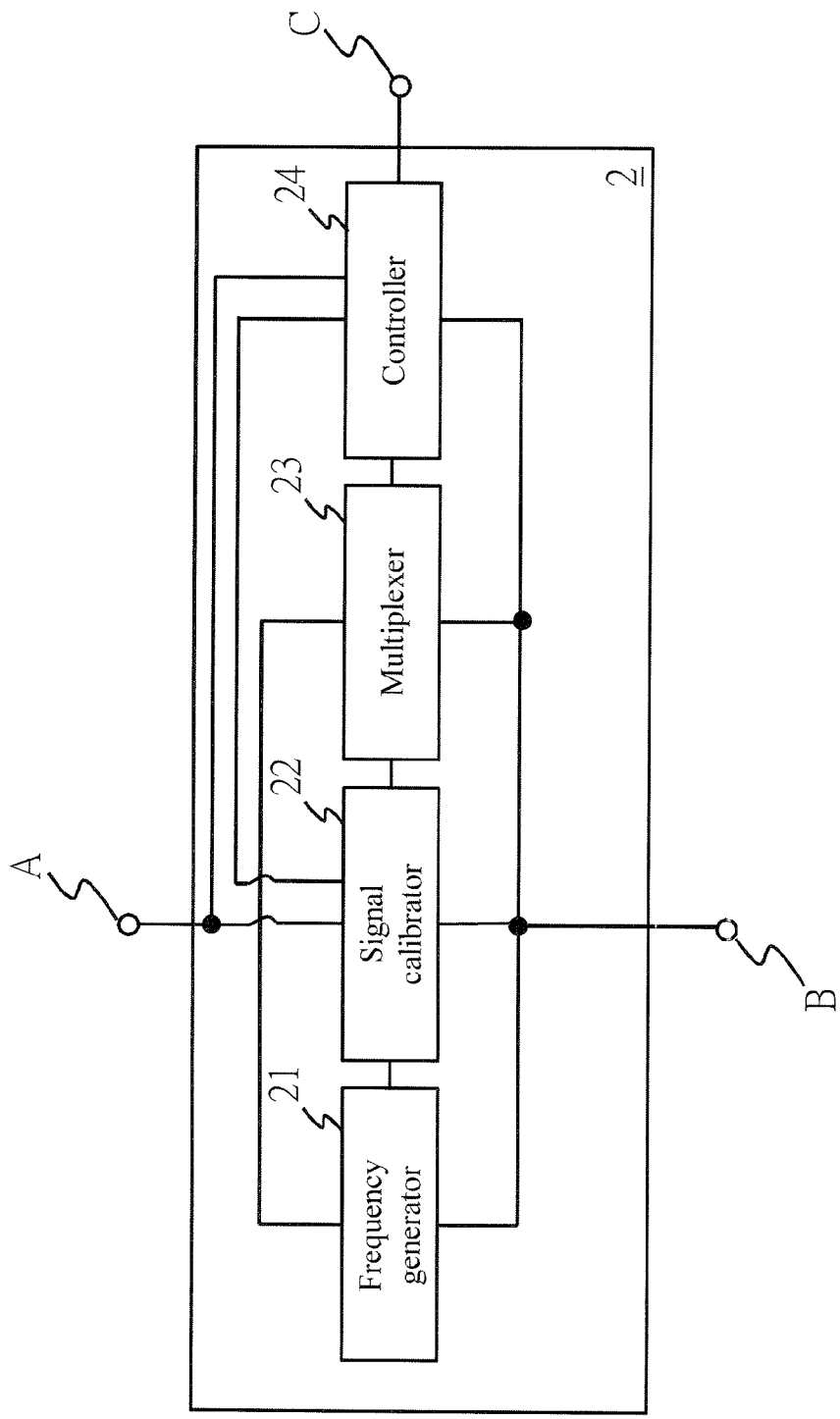
FIG. 5A is a diagrammatic representation of the oscillation module in one embodiment of the present invention.

Next, please refer to FIG. 5A, which shows a view of the oscillation module in the present invention.

In the aforementioned embodiment of the present invention, as shown in FIG. 5A, the oscillation module 2 is a chip and there are only three electronic pins (A, B and C) of the oscillation module 2 electrically connected to the external components. The electronic pin A is the fifth end of the signal calibrator 22 for connecting to the external voltage source 1. The electronic pin B is connected to the third ends of the frequency generator 21, the signal calibrator 22, the multiplexer 23 and the controller 24. The electronic pin B is also a ground end. The electronic pin C is electrically connected to the first end of the controller 24 for outputting the oscillation frequency signal and the serial signal parameter to the programmer 3 and receiving the serial signal parameter and the serial control instruction outputted from the programmer in accordance with the oscillation frequency signal. According to the method and circuit design abovementioned, it is not necessary to design an additional electronic pin in the circuit of the chip of the oscillation module 2 for receiving the operation frequency signal of the programmer. Therefore, about 17% of the chip area of the oscillation module 2 can be decreased so as to reduce the manufacture cost. Besides, since both of the frequency and the phase of the programmer 2 are different from that of the oscillation module 2, the method used to output the first serial signal parameter and the first serial control instruction from the programmer 3 in accordance with the oscillation frequency signal of the oscillation module 2 to the oscillation module 2 can save the asynchronous process of the frequency and phase between the first serial signal parameter of the programmer 3 and that of the oscillation frequency signal of the oscillation module 2. As a result, the time and the procedure of the signal calibration can be also saved. In other word, there are only three electronic pins (A, B and C) required in the oscillation module 2 of the present embodiment.

Figure 5B:
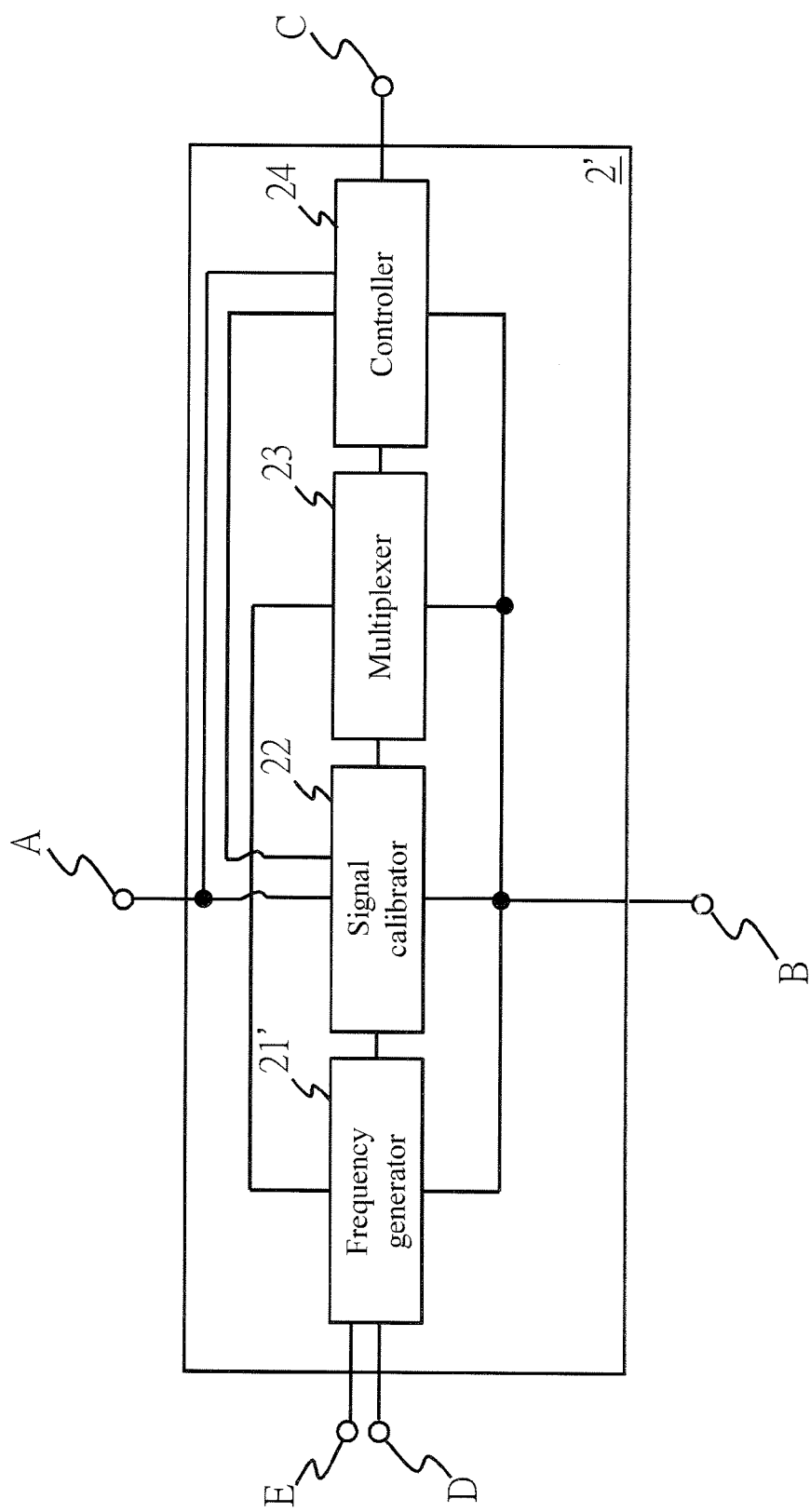
FIG. 5B is a diagrammatic representation of the oscillation module in another embodiment of the present invention.

Finally, please refer to FIG. 5B, which shows a view of another oscillation module in another embodiment of the present invention. The description of the embodiment in FIG. 5B is similar to FIG. 1 and FIG. 5A, and the difference in FIG. 5B is that the oscillation source is disposed outside of the oscillation module 2'. Therefore, there are two additional electronic pins (D and E) in the oscillation module 2' for electrically connecting the frequency generator 21' with the oscillation source which is placed outside of the oscillation source 2', which is disposed outside of the oscillation module 2'. In the present embodiment, it is also not necessary to design an addition electronic pin in the circuit of the chip of the oscillation module 2 to receive the operation frequency signal of the programmer. In other words, there are only five electronic pins (A, B, C, D and E) required in the oscillation module 2' of the present embodiment to operate.

In the aforementioned embodiment of the present invention, the parallel signal parameter and the serial signal parameter include frequency, voltage amplitude, phase, duty cycle and so on, but it is not limited herein. In other words, the signal parameters, such as frequency, voltage amplitude, phase and the duty cycle, can be calibrated by the oscillation module 2 and 2' and the signal calibration method thereof in the present invention.

As described above, the present invention has been described with preferred embodiments thereof and it is understood that many changes and modifications to the described embodiments can be carried out without departing from the scope and the spirit of the invention that is intended to be limited only by the appended claims.

What is claimed is:

1. An oscillation module, comprising:
    a frequency generator including a first end, a second and a third end, which is grounded, and the first end and the second end respectively outputting an oscillation frequency signal;
    a multiplexer including a first end, a second end, a third end and a fourth end, and the second end thereof is electrically connected to the second end of the frequency generator to receive the oscillation frequency signal and the oscillation frequency signal is outputted from the first end thereof, the third end thereof is grounded;
    a controller including a first end, a second end, a third end, a fourth end and a fifth end, and the second end thereof is electrically connected to an external voltage source and the third end thereof is grounded, the fourth end thereof is electrically connected to the first end of the multiplexer to receive the oscillation frequency signal, the first end thereof outputs the oscillation frequency signal and a first serial signal parameter to outside of the oscillation module, and the first end thereof receives the first serial signal parameter, a first serial control instruction and a second serial control instruction in accordance with the oscillation frequency signal, the first serial signal parameter, the first serial control instruction and the second serial control instruction also have the same phase and frequency with the oscillation frequency signal, and the fifth end thereof outputs the first serial signal parameter, the first serial control instruction and the second serial control instruction; and
    a signal calibrator including a first end, a second end, a third end, a fourth end and a fifth end, and the third end thereof is grounded, the first end thereof is electrically connected to the fourth end of the multiplexer, the second end thereof is electrically connected to the fifth end of the controller, the fourth end thereof is connected to the first end of the frequency generator, the fifth end thereof is electrically connected to the external voltage source, the fourth end thereof is to receive the oscillation frequency signal outputted from the first end of the frequency generator, the second end thereof is to receive the first serial signal parameter, the first serial control instruction and the second serial control instruction in accordance with the oscillation frequency signal outputted from the fifth end of the controller, the signal calibrator converts the first serial signal parameter to be a first parallel signal parameter in accordance with the first serial control instruction so as to decode and save the first parallel signal parameter, the signal calibrator reads the first parallel signal parameter in accordance with the second serial signal instruction and converts the first parallel signal parameter back to be the first serial signal parameter to output to the fourth end of the multiplexer, and the first end of the multiplexer outputs the first serial signal parameter to the fourth end of the controller;
    wherein the oscillation module only includes three electrical pins, and one of the electrical pins is electrically connected to the third end of the signal calibrator, the other two of the electrical pins are electrically connected to the first end of the controller and the fifth end of the signal calibrator respectively.

2. The oscillation module according to claim 1, wherein the frequency generator includes a frequency generating unit, and the frequency generating unit includes a first end, a second end, a third end, a fourth end and a fifth end, and the fifth end thereof is grounded, the third end thereof is electrically connected to the second end of the multiplexer, the fourth end thereof is electrically connected to the fourth end of the signal calibrator.

3. The oscillation module according to claim 1, wherein when the voltage source outputs a high voltage level, the first end of the controller receives the first serial signal parameter, the first serial control instruction and the second serial control instruction which are inputted into the oscillation module in accordance with the oscillation frequency signal, the first end of the controller outputs the first serial signal parameter to the outside of the oscillation module, when the voltage source outputs a low voltage level, the second end of the frequency generator outputs the oscillation frequency signal to the second end of the multiplexer, and after the second end of the multiplexer receives the oscillation frequency signal, the first end of the multiplexer outputs the oscillation frequency signal to the fourth end of the controller, and after the fourth end of the controller receives the oscillation frequency signal, the first end of the controller outputs the oscillation frequency signal to the outside of the oscillation module.

4. The oscillation module according to claim 2, wherein the frequency generator further includes an oscillation source electrically connected to the first end and the second end of the frequency generating unit.

5. The oscillation module according to claim 2, wherein the signal calibrator includes:
- a control unit including a first end, a second end, a third end and a fourth end, and the first end thereof is electrically connected to the external voltage source, the third end thereof is electrically connected to the fourth end of the frequency generating unit, the fourth end thereof is electrically connected to the fifth end of the controller, the third end thereof is to receive the oscillation frequency signal outputted from the fourth end of the frequency generating unit, the fourth end thereof is to receive first serial control instruction and the second serial control instruction in accordance with the oscillation frequency signal, the second end and the third end thereof are outputting the first serial control instruction and the second serial control instruction respectively;
- a conversion unit including a first end, a second end, a third end and a fourth end, and the first end thereof is electrically connected to the second end of the control unit, the third end thereof is electrically connected to the fourth end of the frequency generating unit, the fourth end thereof is electrically connected to the fourth end of the frequency generating unit and the fourth end of the multiplexer, the first end thereof is to receive the first serial control instruction outputted from the second end of the control unit, the fourth end thereof is to receive the first serial signal parameter outputted from the fifth end of the controller, and the conversion unit converts the first serial signal parameter to be the first parallel signal parameter in accordance with the first serial control instruction, the second end thereof outputs the first parallel signal parameter and the fourth end thereof outputs the first serial signal parameter;
- a decoding unit including a first end, a second end, and a third end, and the first end thereof is electrically connected to the second end of the conversion unit, the third end thereof is electrically connected to the fourth end of the frequency generating unit, the first end thereof is to receive the parallel signal parameter outputted from the second end of the conversion unit to perform decoding, and the second end thereof outputs the first parallel signal parameter after decoding; and
- a storage unit including a first end, a second end, a third end and a fourth end, and the first end thereof is connected to the second end of the decoding unit, the second end thereof is grounded, the third end thereof is electrically connected to the fourth end of the frequency generating unit, the fourth end thereof is electrically connected to the fourth end of the conversion unit, the first end thereof is to receive the first parallel signal parameter outputted from the second end of the decoding unit to perform storing, the third end thereof is to receive the second serial control instruction outputted from the third end of the control unit and the outputs the first parameter signal parameter to the fourth end of the conversion unit in accordance with the second serial control instruction;
- wherein the fourth end of the conversion unit receives the first parallel signal parameter outputted from the fourth end of the storage unit to convert the first parallel signal parameter back to be the first serial signal parameter.

6. An oscillation module, comprising:
- a frequency generator including a first end, a second and a third end, which is grounded, and the first end and the second end respectively outputting an oscillation frequency signal;
- a multiplexer including a first end, a second end, a third end and a fourth end, and the second end thereof is electrically connected to the second end of the frequency generator to receive the oscillation frequency signal and the oscillation frequency signal is outputted from the first end thereof, the third end thereof is grounded;
- a controller including a first end, a second end, a third end, a fourth end and a fifth end, and the second end thereof is electrically connected to an external voltage source and the third end thereof is grounded, the fourth end thereof is electrically connected to the first end of the multiplexer to receive the oscillation frequency signal, the first end thereof outputs the oscillation frequency signal, and the first end thereof synchronously receives a first serial signal parameter, a first serial control instruction and a second serial control instruction inputted from outside of the oscillation module in accordance with the oscillation frequency signal, the first serial signal parameter, the first serial control instruction and the second serial control instruction also have the same phase and frequency with the oscillation frequency signal, and the fifth end thereof outputs the first serial signal parameter, the first serial control instruction and the second serial control instruction; and
- a signal calibrator including a first end, a second end, a third end, a fourth end and a fifth end, and the third end thereof is grounded, the first end thereof is electrically connected to the fourth end of the multiplexer, the second end thereof is electrically connected to the fifth end of the controller, the fourth end thereof is electrically connected to the first end of the frequency generator, the fifth end thereof is electrically connected to the external voltage source, the fourth end thereof is to receive the oscillation frequency signal outputted from the first end of the frequency generator, the second end thereof is to receive the first serial signal parameter, the first serial control instruction and the second serial control instruction outputted from the fifth end of the controller in accordance with the oscillation frequency signal, the signal calibrator converts the first serial signal parameter to be a first parallel signal parameter in accordance with the first serial control instruction so as to decode and save the first parallel signal parameter, the signal calibrator reads the first parallel signal parameter in accordance with the second serial signal instruction and converts the first parallel signal parameter back to be the first serial signal parameter to output to the fourth end of the multiplexer, and the first end of the multiplexer outputs the first serial signal parameter to the fourth end of the controller;
- wherein the oscillation module only includes five electrical pins, and two of the electrical pins are electrically connected to an oscillation source outside of the oscillation module, and the other three of the electrical pins are electrically connected to the fifth end of the signal calibrator, the first end of the controller and the third end of the signal calibrator respectively.

7. The oscillation module according to claim 6, wherein when the voltage source outputs a high voltage level, the first end of the controller receives the first serial signal parameter, the first serial control command and the second serial control command which are inputted into the oscillation module in accordance with the oscillation frequency signal, the first end of the controller outputs the first serial signal parameter to the outside of the oscillation module, when the voltage source outputs a low voltage level, the second end of the frequency generator outputs the oscillation frequency signal to the second end of the multiplexer, and after the second end of the multiplexer receives the oscillation frequency signal, the first end of the multiplexer outputs the oscillation frequency signal to the fourth end of the controller, and after the fourth end of the controller receives the oscillation frequency signal, the first end of the controller outputs the oscillation frequency signal to the outside of the oscillation module.

8. A frequency calibration method of an oscillation module, comprising:

provemding an oscillation module, and the oscillation module includes a frequency generator, a signal calibrator, a multiplexer and a controller, which are electrically connected to each other;

providing a programmer, which is electrically connected to the oscillation module;

outputting an oscillation frequency signal from the frequency generator and the oscillation frequency signal is outputted from the controller to the programmer;

outputting a first serial signal parameter, a first serial control instruction and a second serial control instruction from the programmer to the controller in accordance with the oscillation frequency signal, the first serial signal parameter, the first serial control instruction and the second serial control instruction also have the same phase and frequency with the oscillation frequency signal;

outputting the first serial signal parameter, the first serial control instruction and the second control instruction from the controller to the signal calibrator;

converting the first serial signal parameter to be a first parallel signal parameter by the signal calibrator in accordance with the first serial control instruction;

decoding and storing the first parallel signal parameter; and reading the stored first parallel signal parameter by the signal calibrator in accordance with the second serial control instruction and converting the first parallel signal parameter back to be the first serial signal parameter so as to output to the multiplexer.

* * * * *